(12) United States Patent
Oishi et al.

(10) Patent No.: US 10,327,364 B2
(45) Date of Patent: Jun. 18, 2019

(54) ELECTROMAGNETIC SHIELDING STRUCTURE HAVING CHOKE STRUCTURE

(71) Applicant: TOSHIBA TEC KABUSHIKI KAISHA, Tokyo (JP)

(72) Inventors: Sadatoshi Oishi, Shizuoka (JP); Sunao Tsuchida, Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/685,149

(22) Filed: Aug. 24, 2017

(65) Prior Publication Data

US 2018/0070483 A1    Mar. 8, 2018

(30) Foreign Application Priority Data

Sep. 8, 2016   (JP) ................................. 2016-175579

(51) Int. Cl.
*G06K 7/10*   (2006.01)
*H05K 9/00*   (2006.01)
*G06K 19/077*   (2006.01)

(52) U.S. Cl.
CPC ....... *H05K 9/0018* (2013.01); *G06K 7/10277* (2013.01); *G06K 7/10415* (2013.01); *G06K 19/07773* (2013.01)

(58) Field of Classification Search
None
See application file for complete search history.

(56) References Cited

U.S. PATENT DOCUMENTS

| 7,561,046 | B2 | 7/2009 | Kato et al. |
| 8,348,163 | B2 | 1/2013 | Oishi |
| 8,742,988 | B2 | 6/2014 | Oishi |
| 2005/0077353 | A1 | 4/2005 | Oishi et al. |
| 2006/0097047 | A1 | 5/2006 | Oishi et al. |
| 2007/0075911 | A1 | 4/2007 | Yaginuma et al. |
| 2007/0164107 | A1 | 7/2007 | Oishi et al. |

(Continued)

FOREIGN PATENT DOCUMENTS

| CN | 205536761 U | 8/2016 |
| EP | 2469976 A1 | 6/2012 |
| JP | H04-10499 A | 1/1992 |

(Continued)

OTHER PUBLICATIONS

U.S. Appl. No. 15/634,568, filed Jun. 27, 2017.

(Continued)

*Primary Examiner* — Kristy A Haupt
(74) *Attorney, Agent, or Firm* — Kim & Stewart LLP

(57) ABSTRACT

An electromagnetic-shielding structure includes an electromagnetic-shielding container having an opening, an electromagnetic-shielding cover that is movably attached to the electromagnetic-shielding container between a closing position and an opening position, and a choke structure. The choke structure is disposed so as to be positioned between a circumference of the electromagnetic-shielding container defining the opening and a circumference region of the electromagnetic-shielding cover when the electromagnetic-shielding cover is at the closing position, and includes a plurality of dielectric layers and a plurality of conductive layers that are alternately stacked.

20 Claims, 6 Drawing Sheets

(56) References Cited

U.S. PATENT DOCUMENTS

2011/0199282 A1   8/2011  Oishi
2012/0138600 A1*  6/2012  Oomori .................. H05B 6/763
                                                           219/647

FOREIGN PATENT DOCUMENTS

JP      H10247586 A      9/1998
JP      2015207119 A    11/2015

OTHER PUBLICATIONS

U.S. Appl. No. 15/622,982, filed Jun. 14, 2017.
Extended European Search Report dated May 30, 2018, filed in counterpart European Patent Application No. 17190119.2 (8 pages).

* cited by examiner

ELECTROMAGNETIC SHIELDING STRUCTURE HAVING CHOKE STRUCTURE

CROSS-REFERENCE TO RELATED APPLICATION

This application is based upon and claims the benefit of priority from Japanese Patent Application No. 2016-175579, filed Sep. 8, 2016, the entire contents of which are incorporated herein by reference.

FIELD

Embodiments described herein relate generally to an electromagnetic shielding structure having a choke structure to prevent leakage of electromagnetic wave therefrom.

BACKGROUND

A code processing device according to the related art scans code symbols, which are attached on articles, one by one, by an operator and conducts processing on the basis of information obtained from the scanned code symbols. According to the code processing device, the operator has to find out the code symbol of each article and then match the code symbol and a code reading face of the code processing device each time. For that reason, a workload of the operator is large, and the workload increases as the number of articles to be scanned increases.

On the other hand, an RFID processing device reads information of articles from radio frequency identification (RFID) tags, which are respectively attached to the articles, and conducts processing on the basis of the read information. This processing device, for example, has a counter in which a flat antenna is embedded and collectively reads information of multiple articles that are placed on the counter from RFID tags attached thereto.

However, if an article with an RFID tag that is not a processing target is placed near the counter, the non-target RFID tag may be read together with the RFID tags attached to the articles to be processed. To handle this issue, an RFID processing device of one type has a metal electromagnetic-shielding box, in which is the articles to be processed are contained, and RFID tags attached to the articles are scanned using an RFID reader/writer of the RFID processing device.

The metal electromagnetic-shielding box has a metal door that is attached to an opening of the box, and a gasket that is formed of a conductor is disposed at a circumference of the opening to prevent leakage of radio waves of the RFID reader/writer from a gap between the box and the metal door.

The gasket can deteriorate due to repeated opening and closing operations of the door, hit or rub by the case, and other causes. For that reason, the gasket that deteriorated with age must be replaced, which causes increase in maintenance cost.

On the other hand, a choke structure, which is widely used in microwave ovens and high frequency heating devices, is an electromagnetic-shielding structure that is less likely to deteriorate and thereby require a less maintenance cost. However, this choke structure is formed by bending a metal in a complex manner, and an expensive mold is necessary to produce the choke structure.

In addition, the frequency of radio waves that are used in an RFID reader/writer is smaller than the frequency of microwaves that are used in microwave ovens. For example, the frequency of the radio waves may be 920 MHz, and the frequency of the microwaves maybe 2.4 GHz. Thus, when a choke structure having the same structure as that of the microwave oven is applied to the electromagnetic-shielding box, the choke structure may have to be excessively large.

DETAILED DESCRIPTION

An embodiment provides an electromagnetic-shielding structure having a compact choke structure, which is produced at a lower cost and requires little maintenance.

In general, according to an embodiment, an electromagnetic-shielding structure includes an electromagnetic-shielding container having an opening, an electromagnetic-shielding cover that is movably attached to the electromagnetic-shielding container between a closing position and an opening position, and a choke structure. The choke structure is disposed so as to be positioned between a circumference of the electromagnetic-shielding container defining the opening and a circumference region of the electromagnetic-shielding cover when the electromagnetic-shielding cover is at the closing position, and includes a plurality of dielectric layers and a plurality of conductive layers that are alternately stacked.

Hereinafter, embodiments will be described with reference to the drawings.

Figure 1:
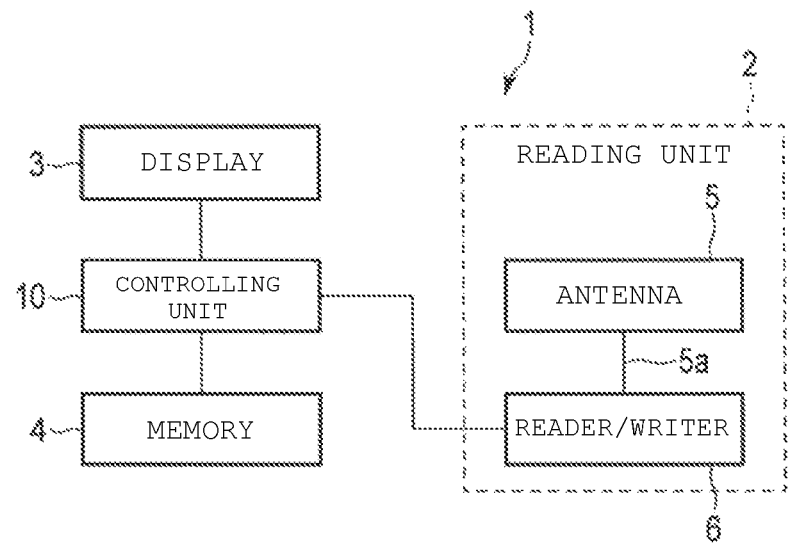
FIG. 1 is a block diagram of an inspection device according to an embodiment.

FIG. 1 is a block diagram of an inspection device 1 according to an embodiment. The inspection device 1 may be used by being placed in a distribution warehouse, for example. The inspection device 1 has a controlling unit 10, a reading unit 2, a display 3 that has an input function, and a memory 4.

Figure 2:
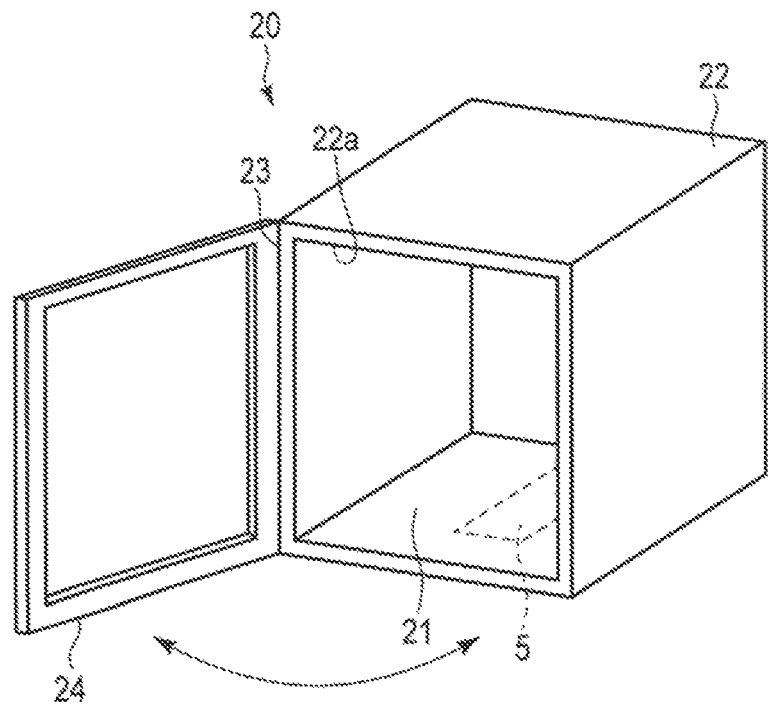
FIG. 2 is an external perspective view of a shielding box according to a first embodiment.

The reading unit 2 has a shielding box 20 that is provided with a storage chamber 21 for containing articles (not shown) with wireless tags. FIG. 2 is a perspective view of the shielding box 20. The shielding box 20 has a box body 22, which has an opening 22a at the front face and has a rectangular block shape, and a door 24, which is provided so that the opening 22a will be openable and closable. The box body 22 and the door 24 are respectively formed of a conductor, such as a metal, to prevent leakage of radio waves.

An end of the door 24 is attached to an end of the box body 22 via a hinge mechanism 23. FIG. 2 shows a situation in which the opening 22a is opened by turning the door 24. Under this condition, articles can be put in and out of the storage chamber 21. An antenna 5 is attached at a bottom wall of the storage chamber 21. The antenna 5 may be provided at a side wall or a top wall of the storage chamber 21. The antenna 5 is connected to a reader/writer 6, which is shown in FIG. 1, via a coaxial cable 5a.

The controlling unit 10 controls the inspection device 1 in response to a command that is input via the display 3, on the basis of a controlling program stored in the memory 4. Specifically, the controlling unit 10 controls the reader/writer 6, which is connected to the antenna 5 of the reading unit 2, and reads information from wireless tags (not shown) attached on articles within the storage chamber 21. Then, the controlling unit 10 executes data processing relating to registration and management of the respective articles on the basis of the read information.

The wireless tag, which is attached on each of the articles, is, for example, a radio frequency identification (RFID) tag, in particular, an RFID tag that operates in a UHF band. The RFID tag is one that stores an article code of the corresponding article and other information, for example.

After radio waves are emitted from the antenna 5, the radio waves from the antenna 5 and waves that are reflected at the box body 22 and other parts are synthesized in the storage chamber 21. The synthesized waves enable communication between the RFID tags that are in the storage chamber 21, that is, the RFID tags attached on the respective articles contained in a case, and the reader/writer 6. As a result, information such as article codes is read from all of the RFID tags.

The following describes details of some embodiments of the shielding box 20.

First Embodiment

As shown in FIG. 2, the box body 22 of the shielding box 20 is formed in a box shape, which has the rectangular opening 22a at the front face. The box body 22 has a depth that is longer than the length of a side of the opening 22a and thus has a shape that is long in the depth direction. Specifically, the box body 22 has the storage chamber 21 that can contain the whole case, which contains multiple articles therein.

Figure 3A:
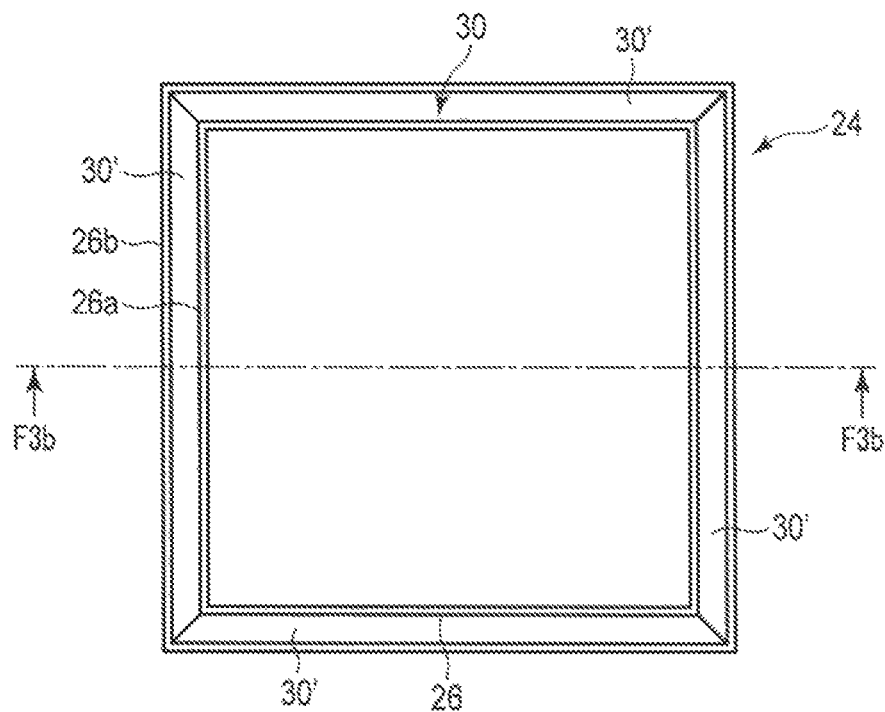
FIG. 3A is a schematic view of a door of the shielding box in FIG. 2 as seen from the inside of the door.
Figure 3B:
FIG. 3B is a cross-sectional view of the door taken along a line F3b-F3b in FIG. 3A.

As shown in FIG. 3, the door 24 is formed of a square plate member having four equal sides. The door 24 is formed so that the opening 22a of the box body 22 will be openable and closable. An operator can put in and take out a case that contains articles, with respect to the storage chamber 21 of the box body 22 through the opening 22a of the box body 22 by making the door 24 open, as shown in FIG. 2.

The box body 22 and the door 24 are respectively formed of a radio wave reflecting member, such as a metal plate, or a radio wave absorbing material that absorbs radio waves. Thus, radio waves, which are emitted from the antenna 5, are prevented from leaking through the box body 22 or the door 24 to the outside of the shielding box 20.

Nevertheless, an inevitable slight gap exists between the box body 22 and the door 24 around the opening 22a, and radio waves can slightly leak through this gap. The radio waves that leaked to the outside of the shielding box 20 allow reading of an RFID tag of an article that is outside the shielding box 20, although the article is not a reading target.

In view of this, in the present embodiment, a choke structure 30 is formed to a gap between the box body 22 and the door 24 to prevent leakage of radio waves. Although the choke structure 30 is provided to the side of the door 24, the choke structure 30 may be provided to the side of the box body 22.

Figure 4:
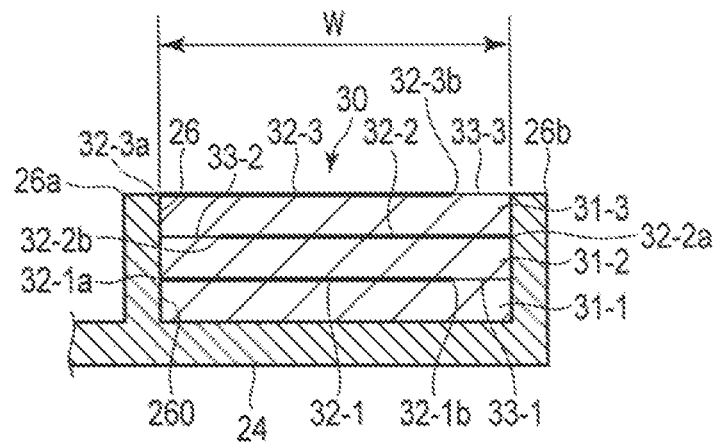
FIG. 4 is an enlarged cross-sectional view of a part of an area F4 in FIG. 3B.

The door 24 has a circular recess portion 26 into which the choke structure 30 is put, at a circumferential edge part of the inside surface side toward the box body 22. The recess portion 26 has a square frame shape, as shown in FIG. 3. The recess portion 26 is formed by providing an inside wall 26a and an outside wall 26b in a protruding manner at the circumferential edge part of the inside surface side of the door 24 as shown in FIG. 4. The inside wall 26a has a square frame shape, and the outside wall 26b has a square frame shape that is slightly larger in size than that of the inside wall 26a. The inside wall 26a is sized to surround the opening 22a of the box body 22. The outside wall 26b is formed at an outer circumferential edge of the door 24.

The choke structure 30 is fit into the circular recess portion 26 between the inside wall 26a and the outside wall 26b. That is, the choke structure 30 is formed in a continuous square circular shape. By closing the door 24 to cover the opening 22a of the box body 22, the surface toward the box body 22, of the choke structure 30 contained in the recess portion 26 is brought into contact with an outside edge of the opening 22a of the box body 22.

More specifically, the choke structure 30 of this embodiment is constituted by combining four structures 30' into a rectangular frame shape, as shown in FIG. 3A. The structures 30' have the same strip shape and are strip-shaped portions. Both ends of the respective structures 30' in the longitudinal direction are inclined by 45 degrees in directions different from each other. That is, the lengths of both side surfaces of the respective structures 30' along the longitudinal direction differ from each other. The four structures 30' are combined into a frame shape in a condition in which the side surfaces that are shorter than the other side surfaces along the longitudinal direction face inward, and the inclined ends of the respective structures 30' are bonded to each other.

As described above, the choke structure 30 is formed by combining the four same structures 30'. Thus, production of only one type of the structures 30' is required, whereby production cost is decreased, and enables more efficient inventory management of the parts. On the other hand, in a case of forming the opening 22a of the box body 22 in a rectangular shape instead of the square shape, two types of structures, which have different lengths from each other, must be prepared to form the choke structure 30. In this case, production cost would be increased, and the inventory management may need more time and effort. Considering this issue, in the present embodiment, the opening 22a of the box body 22 is formed in a square shape, and the choke structure 30 is formed by combining the structures 30' having the same length.

Figure 5:
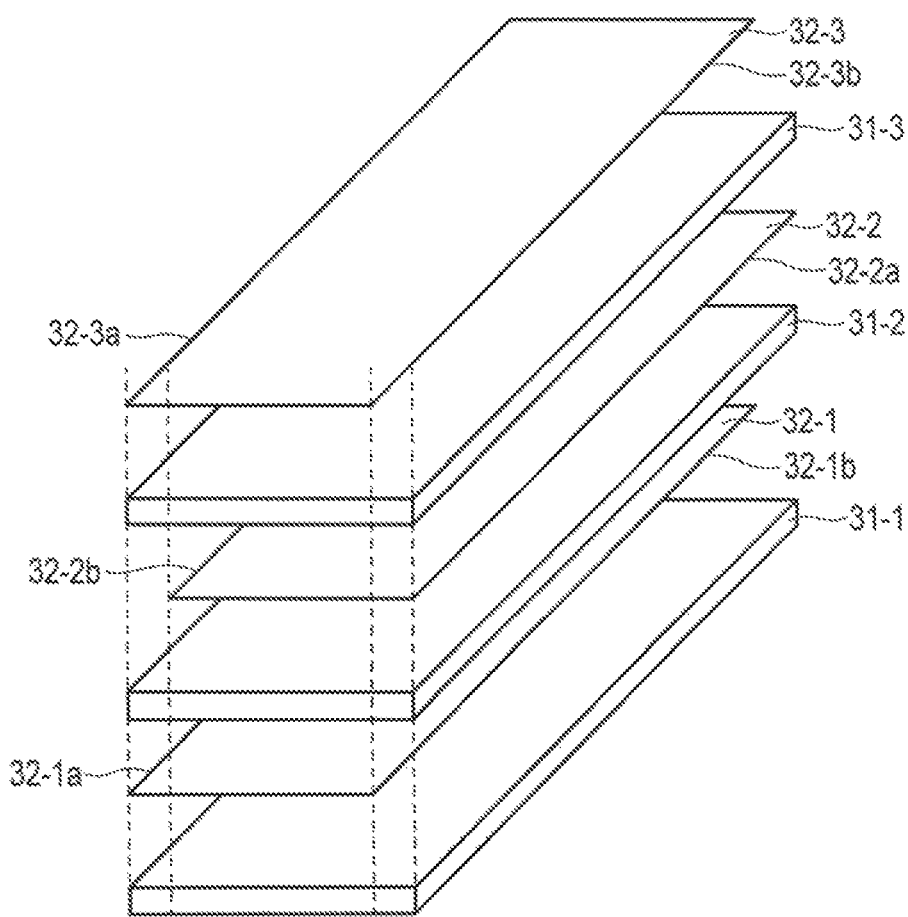
FIG. 5 is an exploded perspective view of a choke structure in FIG. 4.

FIG. 5 is an exploded perspective view showing a stacked structure of the choke structure 30. The choke structure 30 is formed by alternately stacking dielectric layers 31-1, 31-2, and 31-3 and conductor layers 32-1, 32-2, and 32-3. The dielectric layers 31-1, 31-2, and 31-3 are made of a dielectric material and have the same thickness and the same shape. The conductor layers 32-1, 32-2, and 32-3 are made of a conductor and have the same thickness and the same shape. The conductor layers 32-1, 32-2, and 32-3 are, for example, foil-like metal layers, and therefore, they are described in a sheet shape having approximately no thickness in FIG. 5. Each of the layers is stacked in a protruding direction of the inside wall 26a and the outside wall 26b, which form the recess portion 26. FIG. 5 shows a part of the choke structure 30.

The conductor layers 32-1, 32-2, and 32-3 have a width that is smaller than the width of the dielectric layers 31-1, 31-2, and 31-3. In other words, the dielectric layers 31-1, 31-2, and 31-3 have approximately the same width as the width "W" of the recess portion 26 of the door 24, which is a distance between the inside wall 26a and the outside wall 26b. On the other hand, the conductor layers 32-1, 32-2, and 32-3 have a width that is smaller than the width "W".

As shown in FIG. 4, the dielectric layer 31-1 is formed at the bottom of the recess portion 26. The conductor layer 32-1, which is the closest to the bottom of the recess portion 26 among the conductor layers, is stacked on the dielectric layer 31-1. The conductor layer 32-1 has an end 32-1a in the width direction on the left side in FIG. 4, and the end 32-1a is in contact with the inside wall 26a of the recess portion 26. The conductor layer 32-1 has the other end 32-1b in the width direction, and the other end 32-1b is apart from the outside wall 26b. Similarly, the conductor layer 32-2, which is formed to have the dielectric layer 31-2 between the conductor layers 32-1 and 32-2, has an end 32-2a in the width direction on the right side in FIG. 4, and the end 32-2a is in contact with the outside wall 26b. The conductor layer 32-2 has the other end 32-2b in the width direction, and the other end 32-2b is apart from the inside wall 26a. Also, the conductor layer 32-3, which is formed to have the dielectric layer 31-3 between the conductor layers 32-2 and 32-3, has an end 32-3a in the width direction on the left side in FIG. 4, and the end 32-3a is in contact with the inside wall 26a. The conductor layer 32-3 has the other end 32-3b in the width direction, and the other end 32-3b is apart from the outside wall 26b.

The distance between the other end 32-1b of the conductor layer 32-1 on the right side in FIG. 4 and the outside wall 26b, the distance between the other end 32-2b of the conductor layer 32-2 on the left side in FIG. 4 and the inside wall 26a, and the distance between the other end 32-3b of the conductor layer 32-3 on the right side in FIG. 4 and the outside wall 26b, are approximately the same length as the thickness of the dielectric layers 31-1, 31-2, and 31-3.

That is, the width of each of openings 33-3, 33-2, and 33-1 is designed so that a transmission path of leakage radio waves passing through the openings 33-3, 33-2, and 33-1 and the dielectric layers 31-1, 31-2, 31-3 will have an approximately uniform cross section over the whole length. The opening 33-3 is formed between the other end 32-3b of the conductor layer 32-3 and the outside wall 26b. The opening 33-2 is formed between the other end 32-2b of the conductor layer 32-2 and the inside wall 26a. The opening 33-1 is formed between the other end 32-1b of the conductor layer 32-1 and the outside wall 26b.

The length of the transmission path of the leakage radio waves is designed so that the following phenomenon will occur. That is, a leakage radio wave enters from the opening 33-3 and passes through the dielectric layer 31-3, the opening 33-2, the dielectric layer 31-2, the opening 33-1, and then the dielectric layer 31-1. Then, the leakage radio wave is reflected at an inside surface 260 of the inside wall 26a and is emitted from the opening 33-3 after passing through the same path in the reverse direction. At that time, the phase of the reflected leakage radio wave is inverted when emitted from the opening 33-3. As a result, the incident leakage radio wave is canceled by the reflected leakage radio wave. This structure eliminates almost all radio waves that leak through the gap between the box body 22 and the door 24 to the outside of the shielding box 20.

Specifically, in the present embodiment, the length of the half of the transmission path, that is, a length "L" along the transmission path from the opening 33-3 to the inside surface 260 of the inside wall 26a is set to ¼ of the wavelength $\lambda d$ of the leakage radio waves. Thus, the phase of the leakage radio wave that is reflected at the inside surface 260, which is a fixed end, is inverted at the opening 33-3.

Assuming that a free-space wavelength of a leakage radio wave is $\lambda 0$, and the dielectric layers 31-1, 31-2, and 31-3 have a relative permittivity $\varepsilon r$, the wavelength $\lambda d$ of the leakage radio wave passing through the transmission path is represented as $\lambda d = \lambda 0 / \sqrt{\varepsilon r}$. For example, assuming that the dielectric layers 31-1, 31-2, and 31-3 have a relative permittivity $\varepsilon r$ of 4, the wavelength $\lambda d$ of a leakage radio wave passing through the dielectric layers 31-1, 31-2, and 31-3 is half of the free-space wavelength $\lambda 0$. That is, the wavelength of the leakage radio wave is decreased when the leakage radio wave passes through the dielectric materials.

Thus, the wavelength of the leakage radio wave is decreased only by forming the transmission path of the leakage radio wave from the dielectric layers 31-1, 31-2, and 31-3. Accordingly, the length "L" of the transmission path, which is necessary to invert the phase of the reflected wave relative to the incident wave at the gate of the leakage radio wave (opening 33-3), can be short.

On the other hand, the width of the choke structure 30 is determined by the width of the edge of the opening 22a of the box body 22, which faces the choke structure 30. To reduce the outside shape of the shielding box 20 while the capacity of the storage chamber 21 of the shielding box 20 is sufficiently obtained, the width of the edge of the opening 22a is desirably made as small as possible. That is, the width of the choke structure 30 must be in a specific range.

In view of this, in the present embodiment, in addition to forming the transmission path of the leakage radio waves from the dielectric substances, the choke structure 30 that is formed by alternately stacking the dielectric layers and the conductor layers is used. As a result, the width of the choke structure 30 can be set to a desired width. That is, by selecting the numbers of stacked layers of each kind in the choke structure 30, the width of the choke structure 30 can be designed as desired.

Specifically, assuming that the wavelength of a leakage radio wave passing through the dielectric layers 31-1, 31-2, and 31-3 is $\lambda d$, a desired width of the choke structure 30 is "W", and the number of stacked dielectric layers is "n", the width of the choke structure 30 can be set to a desired width by selecting the number "n" of stacked dielectric layers so as to satisfy $W = (\lambda d / 4)/n$.

Practically, it is difficult to specify the length "L" of the transmission path of the leakage radio waves, and it is also difficult to specify the width "W" of the choke structure 30. Thus, the optimum width for the width "W" of the choke structure 30, by which the leakage radio waves are less likely to leak to the outside, must be examined by using a radio wave having a wavelength to be used in reading RFID tags in practice.

As described above, in the present embodiment, the choke structure 30 is formed between the box body 22 and the door 24 of the shielding box 20, whereby a shielding structure is obtained without using a gasket. This structure facilitates maintenance. Moreover, in the present embodiment, the width "W" of the choke structure 30 can be designed as desired, whereby design flexibility of the shielding box 20 increases, and the outside shape of the shielding box 20 can be made compact. Furthermore, in the present embodiment, since the choke structure 30 has the dielectric layers 31-1, 31-2, and 31-3 and the conductor layers 32-1, 32-2, and 32-3 that are alternately stacked, an expensive mold for forming the choke structure 30 is not required, and production cost of the shielding box 20 is decreased.

Second Embodiment

Figure 6:
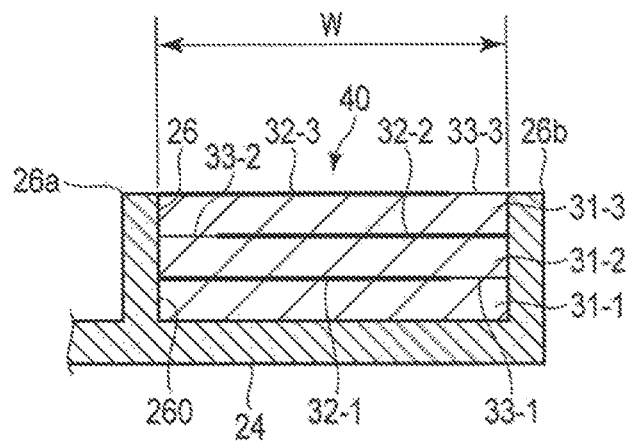
FIG. 6 is an enlarged cross-sectional view of a part of a shielding box according to a second embodiment.
Figure 7:
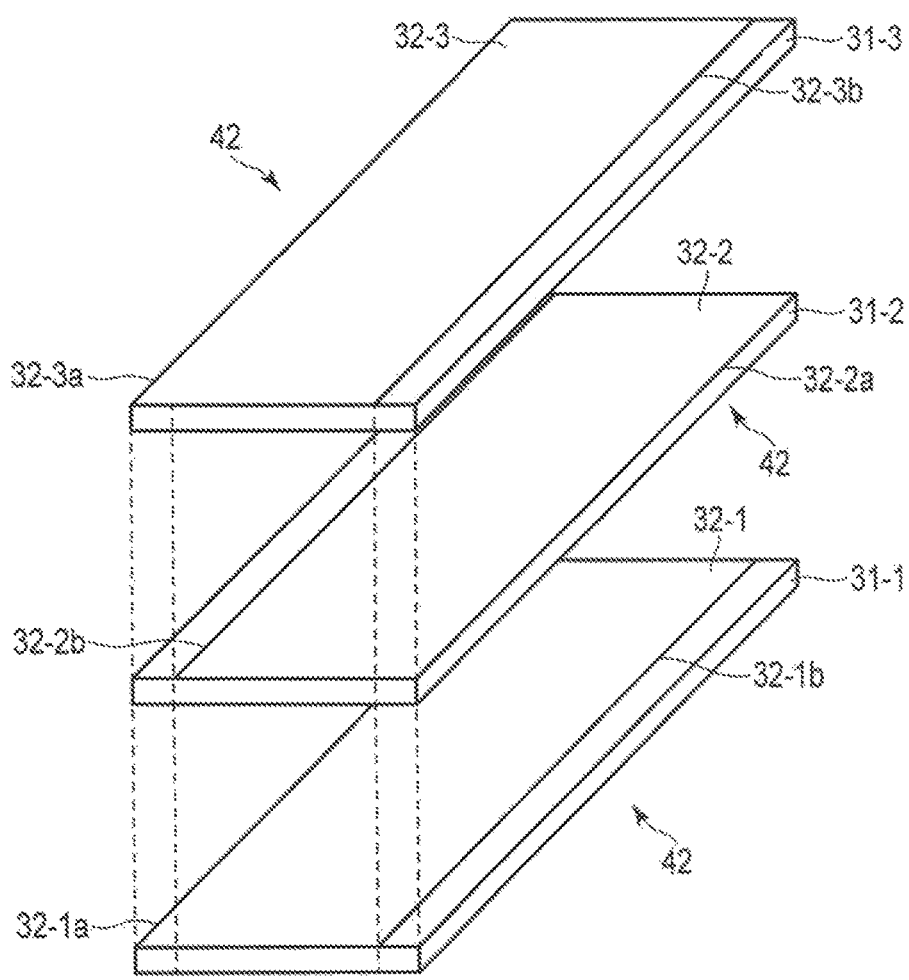
FIG. 7 is an exploded perspective view of a choke structure in FIG. 6.

FIG. 6 is an enlarged cross-sectional view showing apart of a shielding box according to a second embodiment. FIG. 7 is an exploded perspective view showing a stacked structure of a choke structure 40.

The shielding box of the present embodiment has approximately the same structure as the shielding box 20 of the first embodiment except for the choke structure 40. Thus, only the choke structure 40 is described here, and the structure of the shielding box of the present embodiment, which has functions similar to those of the structure of the first embodiment, are not described. Structural components of the choke structure 40, which have functions similar to those of the structural components of the choke structure 30 of the first embodiment, are represented by the same symbols, and the description of the functions of these structural components are omitted.

The choke structure 40 of the present embodiment is constructed by alternately stacking insulator base materials 31-1, 31-2, and 31-3 and copper foils 32-1, 32-2, and 32-3. The insulator base materials 31-1, 31-2, and 31-3 respectively correspond to the dielectric layers 31-1, 31-2, and 31-3 of the choke structure 30 of the first embodiment. The copper foils 32-1, 32-2, and 32-3 respectively correspond to the conductor layers 32-1, 32-2, and 32-3 of the choke structure 30 of the first embodiment.

In producing the choke structure 40, the copper foils 32-1, 32-2, and 32-3 are respectively formed on a surface of the insulator base materials 31-1, 31-2, and 31-3, whereby multiple single-sided substrates 42 having the same shape (see FIG. 7) are produced. Then, the multiple single-sided substrates 42 are stacked with the direction being alternately turned by 180 degrees.

The copper foils 32-1, 32-2, and 32-3 of the single-sided substrates 42 can be respectively formed on the surface of the insulator base materials 31-1, 31-2, and 31-3 by printing, for example. Thus, positioning of the insulator base materials 31-1, 31-2, and 31-3 and the copper foils 32-1, 32-2, and 32-3 can be easily performed with high precision at a low cost. The copper foils 32-1, 32-2, and 32-3 have a width smaller than that of the insulator base materials 31-1, 31-2, and 31-3.

Thus, the present embodiment provides similar effects as those of the first embodiment and facilitates positioning of the insulator base materials 31-1, 31-2, and 31-3 and the copper foils 32-1, 32-2, and 32-3 of the choke structure 40, thereby decreasing production cost. Moreover, precision of positioning the insulator base materials 31-1, 31-2, and 31-3 and the copper foils 32-1, 32-2, and 32-3 of the choke structure 40 is increased, whereby a highly reliable shielding structure can be formed.

Third Embodiment

Figure 8:
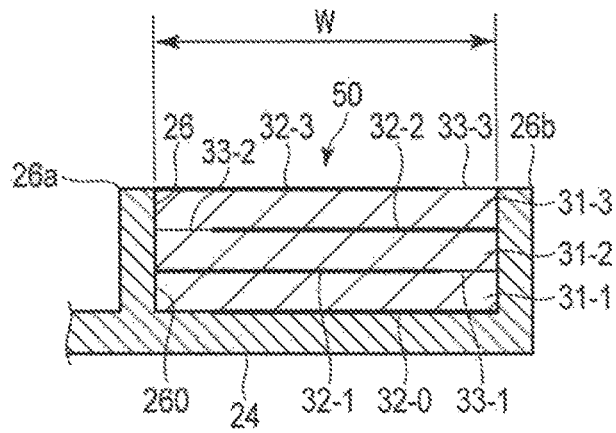
FIG. 8 is an enlarged cross-sectional view of a part of a shielding box according to a third embodiment.
Figure 9:
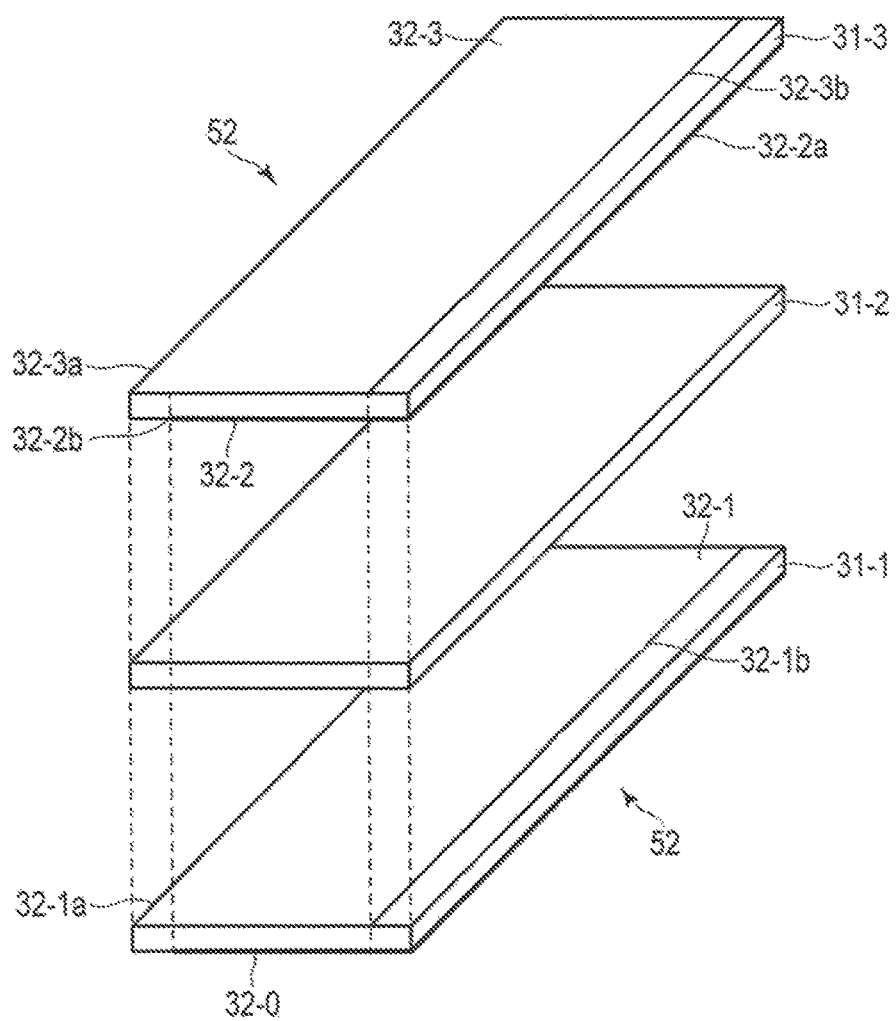
FIG. 9 is an exploded perspective view of a choke structure in FIG. 8.

FIG. 8 is an enlarged cross-sectional view showing a part of a shielding box according to a third embodiment. FIG. 9 is an exploded perspective view of a laminated structure of a choke structure 50.

The shielding box of the present embodiment has approximately the same structure as the shielding box 20 of the first embodiment except for the choke structure 50. Thus, only the choke structure 50 is described here, and the structure of the shielding box 50 according to the present embodiment, which has functions similar to those of the structure of the first embodiment, are not described. Structural components of the choke structure 50, which have functions similar to those of the structural components of the choke structure 40 of the second embodiment, are represented by the same symbols, and the description of the functions of these structural components is omitted.

The choke structure 50 of the present embodiment is formed by alternately stacking insulator base materials 31-1, 31-2, and 31-3 and copper foils 32-1, 32-2, and 32-3. The insulator base materials 31-1, 31-2, and 31-3 respectively correspond to the dielectric layers 31-1, 31-2, and 31-3 of the choke structure 30 of the first embodiment. The copper foils 32-1, 32-2, and 32-3 respectively correspond to the conductor layers 32-1, 32-2, and 32-3 of the choke structure 30 of the first embodiment. The choke structure 50 of the third embodiment also has a copper foil 32-0 between the insulator base material 31-1 and the bottom of the recess portion 26.

To form the choke structure 50, the copper foils 32-0 and 32-1 are respectively formed on both surfaces of the insulator base material 31-1, and the copper foils 32-2 and 32-3 are respectively formed on both surfaces of the insulator base material 31-3, whereby two double-sided substrates 52 having the same shape (see FIG. 9) are formed. Then, the double-sided substrates 52 are stacked with the insulator base material 31-2 being interposed therebetween. Thus, the choke structure 50 of the present embodiment is formed by using one type of the double-sided substrates 52 and one type of the insulator base material 31-2, whereby the copper foil 32-0 lies on the bottom of the recess portion 26. This copper foil 32-0 remains to avoid cost increase due to additional production for a single-sided substrate without the copper foil 32-0.

The copper foils 32-0 and 32-1 of the double-sided substrate 52 can be respectively formed on both surfaces of the insulator base material 31-1 by printing, for example. Also, the copper foils 32-2 and 32-3 of the double-sided substrate 52 can be respectively formed on both surfaces of the insulator base material 31-3 by printing, for example. Thus, high precision positioning of the combination of the insulator base material 31-1 and the copper foils 32-0 and 32-1 and the combination of the insulator base material 31-3 and the copper foils 32-2 and 32-3 can be performed at a low cost.

According to the present embodiment, similar effects as those of the first embodiment and the second embodiment can be obtained, and the shielding box 20 having the choke structure 50 that is highly reliable can be formed with less production cost.

Fourth Embodiment

Figure 10:
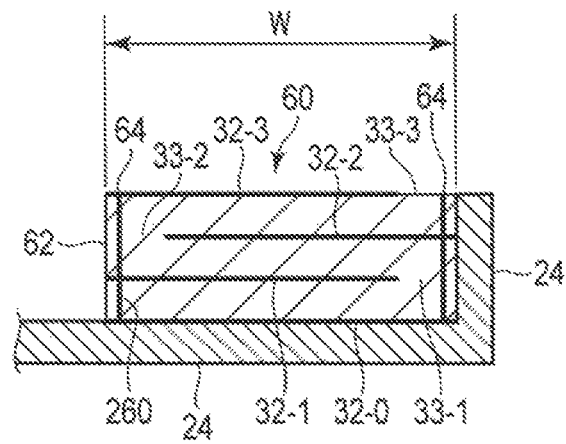
FIG. 10 is an enlarged cross-sectional view of a part of a shielding box according to a fourth embodiment.
Figure 11:
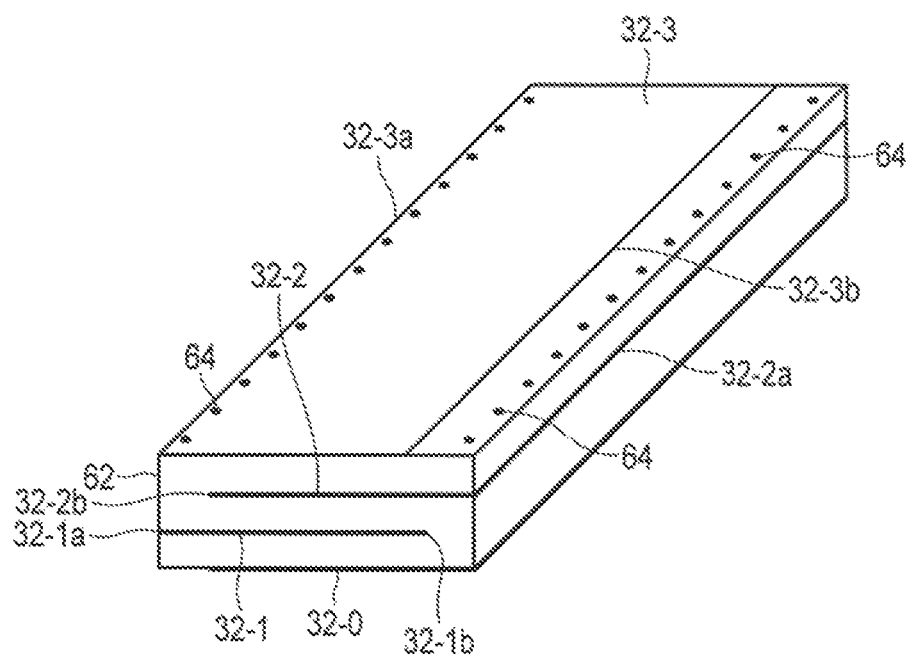
FIG. 11 is a perspective view of a choke structure in FIG. 10.

FIG. 10 is an enlarged cross-sectional view showing a part of the structure of an essential part of a shielding box relating to a fourth embodiment, that is, a part of a choke structure 60 relating to the fourth embodiment. FIG. 11 is a perspective view of a part of the choke structure 60.

The shielding box of the present embodiment has approximately the same structure as the shielding box 20 of the first embodiment except for the choke structure 60. Thus, only the choke structure 60 is described here, and the structure of the shielding box of the present embodiment, which has functions similar to those of the structure of the first embodiment, is not described. Structural components of the choke structure 60, which have functions similar to those of the structural components of the choke structure 50 of the third embodiment, are represented by the same symbols, and the description of the functions of these structural components is omitted.

The choke structure 60 of the present embodiment is formed using a multilayered substrate 62 that is formed of the choke structure 50 of the third embodiment. The choke structure 60 has multiple through holes 64 as conducting portions, and the through holes 64 penetrate through the multilayered substrate 62 near each side surface in the width direction of the multilayered substrate 62. Each of the through holes 64 conducts with the multiple conductor layers 32-0, 32-1, 32-2, and 32-3. The conductor layers 32-0 and 32-3 are respectively arranged on both surfaces of the multilayered substrate 62, and the conductor layers 32-1 and 32-2 are arranged in the inside of the multilayered substrate 62.

The multiple through holes 64 are formed along the longitudinal direction of the choke structure 60 at a pitch as small as possible, thereby functioning as conductor walls with respect to high frequency waves. As a result, leakage radio waves entering from the opening 33-3 pass through within the multilayered substrate 62 and are reflected by the lined through holes 64, and then the reflected leakage radio waves pass through the same route and are emitted from the opening 33-3. Thus, the present embodiment eliminates the need for the inside wall 26a of the recess portion 26 of the door 24 because the multiple through holes 64 inside the choke structure 60 function as a surface for reflecting leakage radio waves in the same manner as the inside surface 260.

According to the present embodiment, similar effects as those of the first to the third embodiments can be obtained, and the shielding box 20 having the choke structure 60 that is highly reliable can be produced with less production cost.

Although the surface for reflecting leakage radio waves is formed by using the multiple through holes 64 in the present embodiment, the surface for reflecting leakage radio waves may be formed by disposing conductive plating at each of the side surfaces in the width direction of the multilayered substrate 62, for example. Alternatively, a layer made of a conductor may be disposed in a space that is formed between the recess portion 26 of the door 24 and the choke structure, instead of forming the through holes 64 to the multilayered substrate 62.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. An electromagnetic-shielding structure comprising:
    an electromagnetic-shielding container having an opening;
    an electromagnetic-shielding cover that is movably attached to the electromagnetic-shielding container between a closing position and an opening position; and
    a choke structure disposed so as to be positioned between a circumference of the electromagnetic-shielding container defining the opening and a circumference region of the electromagnetic-shielding cover when the electromagnetic-shielding cover is at the closing position, the choke structure including a plurality of dielectric layers and a plurality of conductive layers that are alternately stacked,
    the plurality of conductive layers including a first conductive layer and a second conductive layer that are consecutively arranged, with a first dielectric layer of the plurality of dielectric layers disposed therebetween, and
    the first conductive layer having a first inner edge aligned with an inner edge of the first dielectric layer and a first outer edge not aligned with an outer edge of the first dielectric layer, and the second conductive layer having a second inner edge not aligned the inner edge of the first dielectric layer and a second outer edge aligned with the outer edge of the first dielectric layer.

2. The electromagnetic-shielding structure according to claim 1, wherein the choke structure is attached to the electromagnetic-shielding cover.

3. The electromagnetic-shielding structure according to claim 2, wherein
    the electromagnetic-shielding cover includes an outer circumferential wall and an inner circumferential wall at the circumference region thereof, and the choke structure is fit between the outer circumferential wall and the inner circumferential wall.

4. The electromagnetic-shielding structure according to claim 1, wherein
    each of the dielectric layers has a first width along a plane direction of the electromagnetic-shielding cover, and each of the conductive layers has a second width less than the first width.

5. The electromagnetic-shielding structure according to claim 4, wherein
    each of the dielectric layers has a first thickness, and each of the conductive layers has a second thickness less than the first thickness.

6. The electromagnetic-shielding structure according to claim 4, wherein
    the conductive layers are disposed alternately along an inner side surface of the choke structure with a gap with an outer side surface of the choke structure and along the outer side surface of the choke structure with a gap with the outer side surface of the choke structure.

7. The electromagnetic-shielding structure according to claim 4, wherein
    the first width is set to be equal to a wavelength of an electromagnetic wave to be shielded that propagates through the dielectric layers, divided by quadruple of the number of the dielectric layers.

8. The electromagnetic-shielding structure according to claim 1, further comprising:
    an antenna configured to transmit an electromagnetic wave having the wavelength to read data from an RFID tag.

9. The electromagnetic-shielding structure according to claim 8, wherein
    the antenna is embedded in a bottom portion of the electromagnetic-shielding container.

10. The electromagnetic-shielding structure according to claim 1, wherein
    the choke structure further includes a plurality of conductive vias that penetrate through a stack of the dielectric layers and the conductive layers, the conductive vias including a first group of conductive vias arranged along and adjacent to an inner side surface of the choke structure and a second group of conductive vias arranged along and adjacent to an outer side surface of the choke structure.

11. The electromagnetic-shielding structure according to claim 1, wherein
each of an inner side surface and an outer side surface of the choke structure is covered with a conductive layer.

12. The electromagnetic-shielding structure according to claim 1, wherein
each of the opening of the electromagnetic-shielding container and the electromagnetic-shielding cover has a square shape, and
the choke structure includes a same structural portion in correspondence with each edge of the square shape.

13. The electromagnetic-shielding structure according to claim 1, wherein
the electromagnetic-shielding cover is attached to an edge of the circumference of the electromagnetic-shielding container, and rotatable between the closing position and the opening position around a rotational axis corresponding to the edge.

14. An RFID tag reading system comprising:
an electromagnetic-shielding structure having a space therein;
a tag reader disposed to read data from an RFID tag contained in the space through an antenna; and
a controller configured to process the data read from the RFID tag, wherein the electromagnetic-shielding structure includes:
an electromagnetic-shielding container forming the space and having an opening;
an electromagnetic-shielding cover that is movably attached to the electromagnetic-shielding container between a closing position and an opening position; and
a choke structure disposed so as to be positioned between a circumference of the electromagnetic-shielding container defining the opening and a circumference region of the electromagnetic-shielding cover when the electromagnetic-shielding cover is at the closing position, the choke structure including a plurality of dielectric layers and a plurality of conductive layers that are alternately stacked.

15. The RFID tag reading system according to claim 14, wherein the choke structure is attached to the electromagnetic-shielding cover.

16. The RFID tag reading system according to claim 15, wherein
the electromagnetic-shielding cover includes an outer circumferential wall and an inner circumferential wall at the circumference region thereof, and the choke structure is fit between the outer circumferential wall and the inner circumferential wall.

17. The RFID tag reading system according to claim 14, wherein
each of the dielectric layers has a first width along a plane direction of the electromagnetic-shielding cover, and each of the conductive layers has a second width less than the first width, and
the conductive layers are disposed alternately along an inner side surface of the choke structure with a gap with an outer side surface of the choke structure and along the outer side surface of the choke structure with a gap with the outer side surface of the choke structure.

18. The RFID tag reading system according to claim 17, wherein
the first width is set to be equal to a wavelength of an electromagnetic wave to be shielded that propagates through the dielectric layers, divided by quadruple of the number of the dielectric layers.

19. The RFID tag reading system according to claim 14, wherein
the choke structure further includes a plurality of conductive vias that penetrate through a stack of the dielectric layers and the conductive layers, the conductive vias including a first group of conductive vias arranged along and adjacent to an inner side surface of the choke structure and a second group of conductive vias arranged along and adjacent to an outer side surface of the choke structure.

20. The RFID tag reading system according to claim 14, wherein
each of an inner side surface and an outer side surface of the choke structure is covered with a conductive layer.

* * * * *